United States Patent
Park et al.

(10) Patent No.: US 11,761,089 B2
(45) Date of Patent: Sep. 19, 2023

(54) THIN FILM STRUCTURE INCLUDING DIELECTRIC MATERIAL LAYER, METHOD OF MANUFACTURING THE SAME, AND ELECTRONIC DEVICE EMPLOYING THE SAME

(71) Applicant: Samsung Electronics Co., Ltd., Suwon-si (KR)

(72) Inventors: Bo-Eun Park, Hwaseong-si (KR); Jooho Lee, Hwaseong-si (KR); Yongsung Kim, Suwon-si (KR); Jeonggyu Song, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 679 days.

(21) Appl. No.: 16/827,862

(22) Filed: Mar. 24, 2020

(65) Prior Publication Data

US 2021/0115564 A1 Apr. 22, 2021

(30) Foreign Application Priority Data

Oct. 22, 2019 (KR) .......................... 10-2019-0131389

(51) Int. Cl.
*C23C 16/40* (2006.01)
*H10B 51/00* (2023.01)
(Continued)

(52) U.S. Cl.
CPC .............. *C23C 16/56* (2013.01); *C01G 27/02* (2013.01); *C23C 14/08* (2013.01); *C23C 14/5806* (2013.01); *C23C 16/40* (2013.01); *C23C 16/45525* (2013.01); *H10B 51/00* (2023.02); *H10B 53/00* (2023.02);
(Continued)

(58) Field of Classification Search
CPC ........ H10B 51/00; H10B 53/00; C01G 27/02; C23C 14/08; C23C 16/40
See application file for complete search history.

(56) References Cited

U.S. PATENT DOCUMENTS

2011/0057292 A1*  3/2011  Hu .................... H01L 27/10852
                                                    257/532
2012/0267757 A1  10/2012  Antonov et al.
(Continued)

FOREIGN PATENT DOCUMENTS

KR           20190062031 A        6/2019

OTHER PUBLICATIONS

L. C. Gallington et al., 'The structure of liquid and amorphous hafnia' *Materials* 10, 2017.
(Continued)

*Primary Examiner* — Khanh T Nguyen
(74) *Attorney, Agent, or Firm* — HARNESS, DICKEY & PIERCE, P.L.C.

(57) ABSTRACT

A thin film structure includes a first conductive layer, a dielectric material layer on the first conductive layer, and an upper layer on the dielectric material layer. The dielectric material layer including $Hf_xA_{1-x}O_2$ satisfies at least one of a first condition and a second condition. In the first condition the dielectric material layer is formed to a thickness of 5 nm or less and in the second condition the x in $Hf_xA_{1-x}O_2$ is in a range of 0.3 to 0.5.

18 Claims, 6 Drawing Sheets

(51) Int. Cl.
  *C23C 16/56* (2006.01)
  *C23C 16/455* (2006.01)
  *C23C 14/58* (2006.01)
  *C01G 27/02* (2006.01)
  *C23C 14/08* (2006.01)
  *H10B 53/00* (2023.01)

(52) U.S. Cl.
  CPC ...... *C01P 2002/72* (2013.01); *C01P 2002/76* (2013.01); *C01P 2004/24* (2013.01); *C01P 2006/40* (2013.01)

(56) References Cited

U.S. PATENT DOCUMENTS

| | | | |
|---|---|---|---|
| 2016/0064655 A1* | 3/2016 | Tao | H10B 53/30 257/4 |
| 2019/0148390 A1 | 5/2019 | Frank | |
| 2019/0165088 A1 | 5/2019 | Cho et al. | |

OTHER PUBLICATIONS

Osamu Ohtaka et al., 'Phase Relations and Volume Changes of Hafnia under High Pressure and High Temperature' *Journal of the American Ceramic Society*, vol. 84, No. 6, 2001, pp. 1369-1373.

L. Xu et al., 'General relationship for cation and anion doping effects on ferroelectric $HfO_2$ formation' *IEEE*, 2016, pp. 608-611.

T. D. Huan et al., 'Pathways towards ferroelectricity in hafnia' *Physical Review B*, 90, 2014, pp. 064111-1-064111-5.

S. J. Kim et al., 'Large ferroelectric polarization of $TiN/Hf_{0.5}Zr_{0.5}O_2/TiN$ capacitors due to stress-induced crystallization at low thermal budget' Applied Physics Letters, 111, 2017, 242901.

S. W. Smith et al., 'Pyroelectric response in crystalline hafnium zirconium oxide ($Hf_{1-x}Zr_xO_2$) thin films' *Applied Physics Letters*, 110, 2017, 072901.

M.D. Henry et al., 'Stabilization of ferroelectric phase of $Hf_{0.58}Zr_{0.42}O_2$ on NbN at 4 K' *Applied Physics Letters*, 114, 2019, 092903.

J. Müller et al., 'Ferroelectricity in Simple Binary $ZrO_2$ and $HfO_2$' *NANO Letters*, 12, 2012, pp. 4318-4323.

Zhen Fan et al.,'Ferroelectric $HfO_2$-based materials for next-generation ferroelectric memories' *Journal of Advanced Dielectrics*, vol. 6, No. 2, 2016, pp. 1630003-1-1630003-11.

Min Kyuk Park et al., 'Understanding the formation of the metastable ferroelectric phase in hafnia-zirconia solid solution thin films' *Nanoscale*, 10, 2018, pp. 716-725.

Si Joon Kim et al., 'Effect of film thickness on the ferroelectric and dielectric properties of low-temperature (400 °C) $Hf_{0.5}Zr_{0.5}O_2$ films' *Applied Physics Letters*, 112, 2018, pp. 172902-1-172902-4.

Tim Böscke, 'Crystalline Hafnia and Zirconia Based Dielectrics for Memory Applications' Thesis, Jan. 2010.

* cited by examiner

THIN FILM STRUCTURE INCLUDING DIELECTRIC MATERIAL LAYER, METHOD OF MANUFACTURING THE SAME, AND ELECTRONIC DEVICE EMPLOYING THE SAME

CROSS-REFERENCE TO RELATED APPLICATION

This application claims the benefit of Korean Patent Application No. 10-2019-0131389, filed on Oct. 22, 2019, in the Korean Intellectual Property Office, the disclosure of which is incorporated herein in its entirety by reference.

BACKGROUND

1. Field

A thin film structure including a dielectric material layer, a method of manufacturing the same, and an electronic device including the same.

2. Description of Related Art

Recently, with the demand for higher integration and higher performance of electronic devices, the miniaturization and high performance of electronic devices have been required. The electronic circuits may include a number of metal insulator metal (MIM) capacitors and metal oxide semiconductor (MOS) transistors, and in order to realize the miniaturization, large capacity, and high performance, a dielectric material layer capable of performing desired operating characteristics even with a small thickness is beneficial.

SUMMARY

Provided are thin film structures including a dielectric material layer having a thin thickness and exhibiting desired operating characteristics, methods of manufacturing the same, and electronic devices including the same.

Additional aspects will be set forth in part in the description which follows and, in part, will be apparent from the description, or may be learned by practice of the presented embodiments of the disclosure.

According to an aspect of an embodiment, a thin film structure comprises: a first conductive layer; a dielectric material layer including $Hf_xA_{1-x}O_2$, the dielectric material layer satisfying at least one of a first condition and a second condition; and an upper layer on the dielectric material layer, wherein the first condition is the dielectric material layer has a thickness of about 5 nm or less, and the second condition is x in the $Hf_xA_{1-x}O_2$ is in a range of 0.3 to 0.5, wherein the dielectric material layer has ferroelectric property.

The first conductive layer may include NbN.

The upper layer may include a second conductive layer including at least one component different from a component included in the first conductive layer.

The dielectric material layer may have an orthorhombic crystal phase.

The A in $Hf_xA_{1-x}O_2$ may include Zr.

According to an aspect of an embodiment, a method of manufacturing a thin film structure, the method includes: preparing a base layer; forming a first conductive layer on the base layer; forming a dielectric material layer on the first conductive layer to satisfy at least one of a first condition and a second condition, the first condition in which the dielectric material layer is formed to include $Hf_xA_{1-x}O_2$ to a thickness of 5 nm or less and the second condition in which a composition of x in $Hf_xA_{1-x}O_2$ is in a range of 0.3 to 0.5; performing a first heat treatment process on the dielectric material layer; forming an upper layer on the dielectric material layer; and performing a second heat treatment process so that the dielectric material layer has a ferroelectric property by changing a phase of the dielectric material layer after forming the upper layer.

The dielectric material layer may crystallize into a first crystalline phase in the first heat treatment process, and the first crystalline phase is changed into a second crystalline phase in the second heat treatment process.

The second crystalline phase may have an orthorhombic crystal phase.

The second heat treatment process may include cooling the dielectric material layer after an application of heat. The crystal nuclei may be formed in the dielectric material layer in the first heat treatment process, and the dielectric material layer may be crystallized into a first crystalline phase during the application of heat, and then the first crystalline phase may be changed into an orthorhombic crystalline phase during the cooling.

The at least one of the first and second heat treatment processes may be in a temperature range applicable to a semiconductor device.

The first conductive layer may include NbN.

The upper layer may include a second conductive layer including at least one component different from a component included in the first conductive layer.

The A in $Hf_xA_{1-x}O_2$ may include Zr.

According to an aspect of an embodiment, an electronic device includes a base layer and the thin film structure described above on the base layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereafter, the inventive concepts will be described more fully with reference to the accompanying drawings, in which embodiments of the inventive concepts are shown. In the drawings, like reference numerals are used to like elements throughout the specification, and sizes of constituent elements may be exaggerated for clarity and convenience of explanation. The embodiments of the inventive concepts are capable of various modifications and may be embodied in many different forms.

When an element or layer is referred to as being "on" or "above" another element or layer, the element or layer may be directly on another element or layer or intervening elements or layers. It will be understood that, although the terms 'first', 'second', etc. may be used herein to describe various elements, these terms are only used to distinguish one element from another. These terms do not limit the substance or structure of the constituent elements. As used herein, the singular forms are intended to include the plural forms as well, unless the context clearly indicates otherwise. It should be understood that, when a part "comprises" or "includes" an element in the specification, unless otherwise defined, it is not excluding other elements but may further include other elements. The term "above" and similar directional terms may be applied to both singular and plural.

When an electric field is applied to a dielectric material, a dielectric polarization phenomenon in which polarized molecules are aligned occurs. The degree of polarization is proportional to the applied electric field, and may be expressed as a factor of the permittivity $\varepsilon$ of the dielectric material. The permittivity $\varepsilon$ of a dielectric material may be expressed as a factor of the relative permittivity $\varepsilon_r$, also referred to as a dielectric constant, and the dielectric permittivity $\varepsilon_0$ in vacuum. Since the dielectric permittivity below does not deal with absolute values, the above expressions may be interchangeably proportional to an electric field.

On the other hand, depending on the molecular structure of a dielectric material, the degree of dielectric polarization may vary according to a direction of an applied electric field.

In the case of a material showing ferroelectric properties, after a dielectric polarization is formed by an applied electric field E, the dielectric polarization does not return to zero even after the applied electric field disappears, and thus, a certain amount of residual polarization may remain. That is, a material that shows a ferroelectric property may have polarization characteristics depending on a history of an applied electric field E, and the ferroelectric property generally shows a higher dielectric constant than a paraelectric property, and thus, considering that the ferroelectric property material may show a residual polarization characteristic after the applied electric field disappears, the ferroelectric property material may be used in a nonvolatile memory device.

A thin film including a dielectric material showing the ferroelectric property is applicable to various fields, for example, a nonvolatile memory device, such as ferroelectric random access memory (FERAM) and a capacitor.

Figure 1:
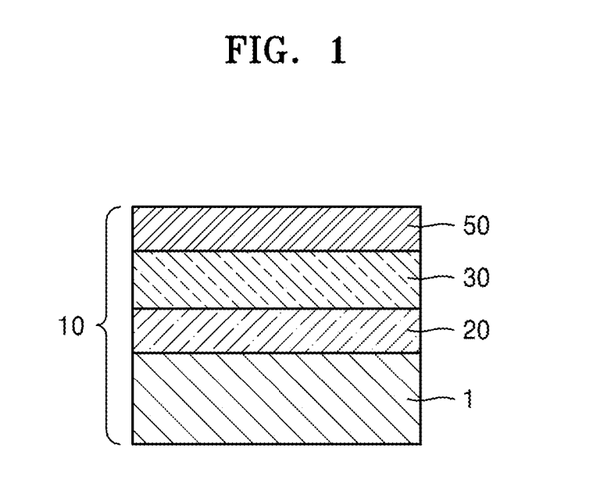
FIG. 1 is a schematic cross-sectional view of a thin film structure including a dielectric material layer according to an embodiment.

FIG. 1 is a schematic cross-sectional view of a thin film structure 10 including a dielectric material layer 30 according to an embodiment.

Referring to FIG. 1, the thin film structure 10 according to an embodiment may include a first conductive layer 20, the dielectric material layer 30 including Hf$_x$A$_{1-x}$O$_2$, and an upper layer 50 sequentially stacked on a base layer 1.

The base layer 1 may be provided with a substrate, such as a semiconductor substrate or an insulating substrate. For example, the base layer 1 may include various semiconductor substrates, such as a silicon substrate, a silicon carbide substrate, a germanium substrate, a silicon-germanium substrate, etc. Also, the base layer 1 may include an insulating substrate, such as a sapphire substrate. The base layer 1 may further include various structures of electronic devices to which the thin film structure 10 according to an embodiment is applied, in addition to a substrate, such as a semiconductor substrate or an insulating substrate. Also, the base layer 1 may further include an insulating layer on the substrate.

Figure 2:
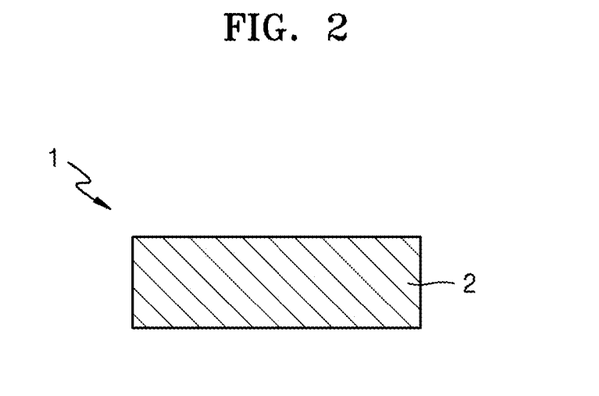
FIG. 2 is a diagram showing a case in which a substrate is provided as a base layer.
Figure 3:
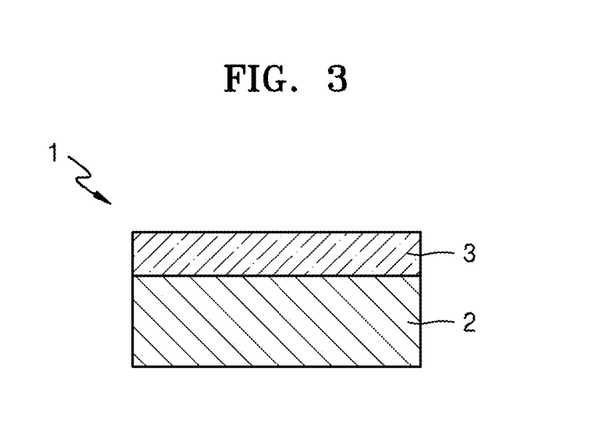
FIG. 3 is a diagram showing a case in which a base layer includes a substrate and an insulating layer.

FIG. 2 is a diagram showing a case in which a substrate 2 is provided as the base layer 1. FIG. 3 is a diagram showing a case in which the base layer 1 includes the substrate 2 and an insulating layer 3 on the substrate 2. When a semiconductor substrate is provided as the substrate 2, as shown in FIG. 3, the insulating layer 3 may further be included on the substrate 2. Also, even when the insulating substrate is provided as the substrate 2, the insulating layer 3 may further be provided on the substrate 2 as shown in FIG. 3. The insulating layer 3 may be a layer for suppressing or preventing electrical leakage. Silicon oxide (SiO), aluminum oxide (AlO), hafnium oxide (HfO), zirconium oxide (ZrO), or a two-dimensional (2D) insulator may be used as the insulating layer 3. The 2D insulator may include a material, such as hexagonal boron nitride (h-BN). However, the material of the insulating layer 3 is not limited thereto. Various structures of the electronic devices to which the thin film structure 10 is applied may further be included on the base layer 1.

The first conductive layer 20 may include a material with a good lattice match with the dielectric material layer 30 to promote the crystallization of the dielectric material layer 30 during processing. The material with the good lattice match may be a material comprising a cubic crystalline structure with a lattice constant about 4.39 Å. For example, the first conductive layer 20 may include niobium nitride (NbN). The NbN may be included in an NbN layer. The NbN layer may have a good lattice match with Hf$_x$A$_{1-x}$O$_2$ of the dielectric material layer 30, and thus, may promote crystallization of the dielectric material layer 30. For example, the NbN layer of the first conductive layer 20 may contact the dielectric material layer 30, and may promote the crystallization of the $Hf_xA_{1-x}O_2$ during the processing of the thin film structure 10. The A conductive layer (not illustrated), for example, a TiN layer including an electrode material applied to a semiconductor device, may further be provided between the base layer 1 and the first conductive layer 20. For example, the first conductive layer 20 may have a multilayer structure including an NbN layer and a conductive layer including at least one other electrode material. Even when the first conductive layer 20 has a multilayer structure further including a conductive layer formed of another electrode material, an upper layer of the first conductive layer 20 may be the NbN layer, and thus the dielectric material layer 30 may contact the NbN layer.

In this way, when a conductive layer including an electrode material applied to a semiconductor device is further provided between the base layer 1 and the first conductive layer 20, or the first conductive layer 20 has a multilayer structure including the NbN layer and a conductive layer including at least one other electrode material, the conductive layer may include the same material as or a different material from that of the upper layer 50. In another embodiment, the base layer 1 may comprise a conductive or semiconductive material, and may include the electrode material.

The upper layer 50 may be formed on the dielectric material layer 30 and may include, for example, a second conductive layer including an electrode material applied to a semiconductor device. The upper layer 50 may include at least one component different from a component of the material included in the first conductive layer 20. For example, the upper layer 50 may include an oxide, nitride, and/or oxynitride wherein the metal, semi-metal, and/or semiconductor is different from at least one of the equivalent components in the first conductive layer 20. For example, the upper layer 50 may include TiN when the first conductive layer 20 includes NbN. Also, the upper layer 50 may include a metal (e.g., W, Mo, Ni, etc.), a conductive oxide (e.g., $RuO_2$, $SrRuO_3$, ITO, etc.), and/or a 2D material (e.g., graphene). The upper layer 50 may also include metal nitride or metal oxynitride. As another example, the upper layer 50 may include a layer including a material included in the first conductive layer 20. For example, the upper layer 50 may include an NbN layer. Here, it is illustrated that the upper layer 50 includes a conductive material, but the material for forming the upper layer 50 is not limited to the conductive material and may vary depending on the type of electronic device to which the thin film structure 10 according to an embodiment is applied.

The dielectric material layer 30 includes $Hf_xA_{1-x}O_2$ on the first conductive layer 20 and may be formed to have a ferroelectric property. The dielectric material layer 30 may be formed to a thickness of about 5 nm or less. Also, the dielectric material layer 30 may be formed to have a composition in which x is about 0.3 to 0.5 in $Hf_xA_{1-x}O_2$. When a condition that the dielectric material layer 30 of $Hf_xA_{1-x}O_2$ is formed to a thickness of 5 nm or less is referred to as a first condition and a condition that the composition of x is to be 0.3 to 0.5 in $Hf_xA_{1-x}O_2$ is referred to as a second condition, the dielectric material layer 30 may be formed to satisfy either or both of the first and second conditions. Also, the dielectric material layer 30 may be formed to have an orthorhombic crystal phase. In the dielectric material layer 30 including $Hf_xA_{1-x}O_2$ of the thin film structure 10 according to the present embodiment, A may include Zr.

For example, the dielectric material layer 30 may include $Hf_xA_{1-x}O_2$ having a thickness of about 5 nm or less and may have a composition in which x is about 0.3 to 0.5. The dielectric material layer 30 may be formed such that, after depositing an $HfO_2$ layer to a desired thickness, the $HfO_2$ layer is doped with A, for example, Zr. The dielectric material layer 30 may be formed by repeating the deposition process of the $HfO_2$ layer and the doping process of A until the dielectric material layer 30 has a desired thickness.

In order to form the dielectric material layer 30, deposition methods, for example, an atomic layer deposition (ALD) method, a metal organic atomic layer deposition (MOALD) method, a chemical vapor deposition (CVD) method, a metal organic chemical vapor deposition (MOCVD) method, or a physical vapor deposition (PVD) method may be used.

FIGS. 4A to 4G are schematic diagrams showing a method of manufacturing the thin film structure 10, according to an embodiment.

Figure 4A:
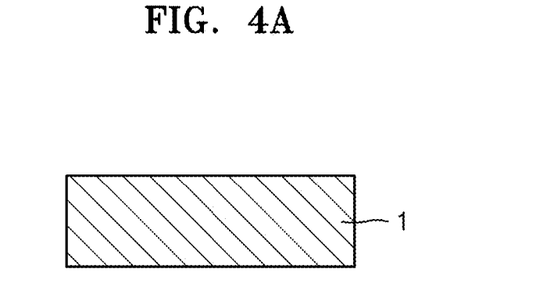
FIGS. 4A to 4G are schematic diagrams showing a method of manufacturing a thin film structure, according to an embodiment.

First, in order to form the thin film structure 10, as shown in FIG. 4A, the base layer 1 is prepared. As described with reference to FIGS. 2 and 3, as the base layer 1, the substrate 2, such as a semiconductor substrate or an insulating substrate, may be provided. Also, the insulating layer 3 may further be provided on the substrate 2.

For example, the base layer 1 may include a substrate, such as a semiconductor substrate or an insulating substrate. For example, the base layer 1 may include various semiconductor substrates, such as a silicon substrate, a silicon carbide substrate, a germanium substrate, a silicon-germanium substrate, etc. Also, the base layer 1 may include an insulating substrate, such as a sapphire substrate. The base layer 1 may further include various structures of electronic devices to which the thin film structure 10 according to an embodiment is applied, in addition to a substrate, such as a semiconductor substrate or an insulating substrate. Also, the base layer 1 may further include an insulating layer on the substrate.

FIG. 2 is a diagram showing a case in which a substrate 2 is provided as the base layer 1. FIG. 3 is a diagram showing a case in which the base layer 1 includes the substrate 2 and an insulating layer 3 on the substrate 2. When a semiconductor substrate is provided as the substrate 2, as shown in FIG. 3, the insulating layer 3 may further be included on the substrate 2. Also, even when the insulating substrate is provided as the substrate 2, the insulating layer 3 may further be provided on the substrate 2 as shown in FIG. 2. The insulating layer 3 may be a layer for suppressing or preventing electrical leakage. Si oxide (SiO), Al oxide (AlO), Hf oxide (HfO), Zr oxide (ZrO), or a 2D insulator may be used as the insulating layer 3. The 2D insulator may include a material, such as hexagonal boron nitride (h-BN). However, the material of the insulating layer 3 is not limited thereto. Various structures of the electronic devices to which the thin film structure 10 is applied may further be included on the base layer 1.

Figure 4B:
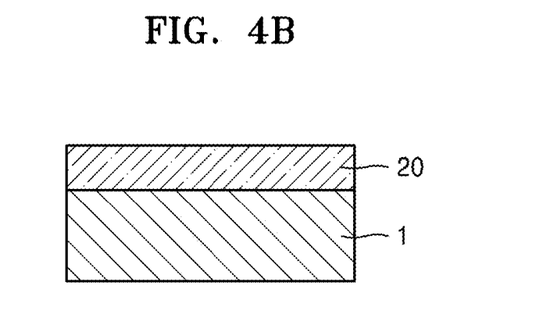

Next, as shown in FIG. 4B, the first conductive layer 20 may be formed on the base layer 1. The first conductive layer 20 may include, for example, NbN. For example, the first conductive layer 20 may include an NbN layer.

Here, a conductive layer, for example, a TiN layer including an electrode material applied to a semiconductor device may further be provided between the base layer 1 and the first conductive layer 20. Also, the first conductive layer 20 may have a multilayer structure including an NbN layer and a conductive layer including at least one other electrode material. Even in the multilayer structure in which the first conductive layer 20 further includes a conductive layer formed of another electrode material, an upper layer of the first conductive layer 20 may be formed of an NbN layer, and thus the dielectric material layer 30 may be formed to contact the NbN layer.

In this way, a conductive layer including an electrode material applied to a semiconductor device may be further provided between the base layer 1 and the first conductive layer 20, or the first conductive layer 20 may have a multilayer structure including the NbN layer and a conductive layer including at least one other electrode material.

Figure 4C:
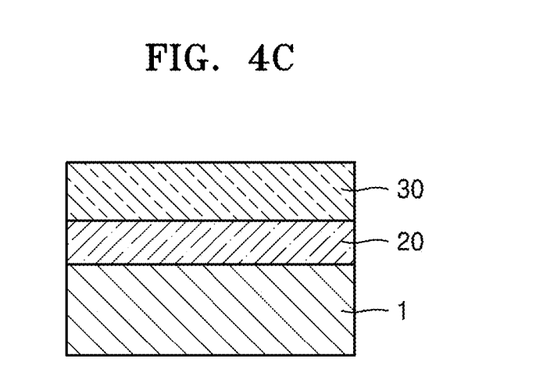

Next, as shown in FIG. 4C, the dielectric material layer 30 including $Hf_xA_{1-x}O_2$ may be formed on the first conductive layer 20. The dielectric material layer 30 may be formed to a thickness of about 5 nm or less. Also, the dielectric material layer 30 may be formed to have a composition in which x is about 0.3 to 0.5 in $Hf_xA_{1-x}O_2$. When the condition that the dielectric material layer 30 of $Hf_xA_{1-x}O_2$ is formed to a thickness of 5 nm or less is referred to as a first condition and the condition that the composition of x is to be 0.3 to 0.5 in $Hf_xA_{1-x}O_2$ is referred to as a second condition. The dielectric material layer 30 may be formed to satisfy either or both of the first and second conditions. In the dielectric material layer 30 including $Hf_xA_{1-x}O_2$ of the thin film structure 10, A may include Zr.

For example, the dielectric material layer 30 may include $Hf_xA_{1-x}O_2$ having a thickness of about 5 nm or less and may have a composition in which x is about 0.3 to 0.5. The dielectric material layer 30 may be formed such that, after depositing an $HfO_2$ layer, the $HfO_2$ layer is doped with A, for example, Zr. The dielectric material layer 30 may be formed by repeating the deposition process of the $HfO_2$ layer and the doping process of A Zr until the dielectric material layer 30 has a desired thickness.

In order to form the dielectric material layer 30, deposition methods, for example, an ALD method, an MOALD method, a CVD method, an MOCVD method, or a PVD method may be used.

In this way, when the dielectric material layer 30 of $Hf_xA_{1-x}O_2$ is formed on the first conductive layer 20, since the NbN layer of the first conductive layer 20 has a good lattice match with $Hf_xA_{1-x}O_2$ of the dielectric material layer 30, the crystallization of the dielectric material layer 30 may be promoted.

Figure 4D:
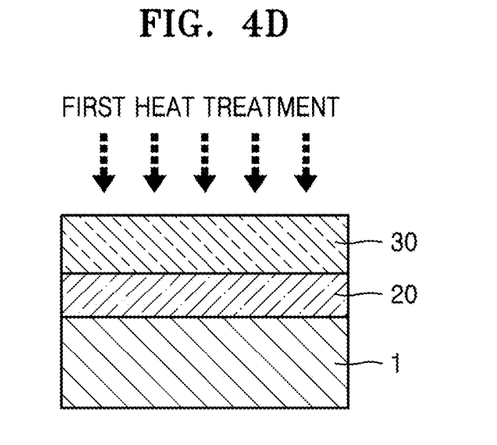

Next, as shown in FIG. 4D, the dielectric material layer 30 may be crystallized by performing a first heat treatment process on the dielectric material layer 30. Crystal nuclei may be formed in the dielectric material layer 30 in the first heat treatment process, and the dielectric material layer 30 may be crystallized into a first crystal phase, for example, a tetragonal crystal phase. In this case, a heat treatment temperature in the first heat treatment process may be a temperature range applicable for the processing of a semiconductor device, for example, 400° C. to 600° C.

Figure 4E:
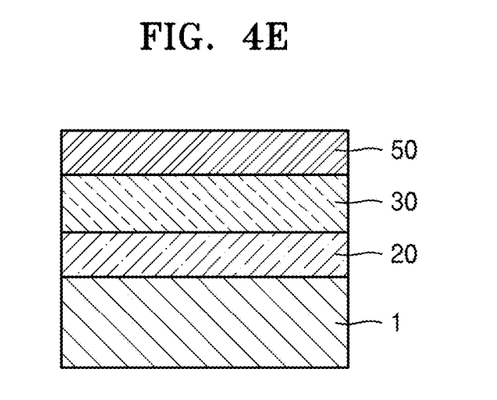

Next, as shown in FIG. 4E, a pre-cursor structure of the thin film structure 10, including the first conductive layer 20, the dielectric material layer 30, and the upper layer 50, may be formed by forming the upper layer 50 on the dielectric material layer 30.

The upper layer 50 may be formed on the dielectric material layer 30 and may include a second conductive layer including an electrode material applicable to a semiconductor device. The upper layer 50 may include at least one component different from the components included in the first conductive layer 20. For example, the upper layer 50 may include TiN. Also, the upper layer 50 may include a metal (e.g, W, Mo, Ni, etc.), a conductive oxide (e.g., $RuO_2$, $SrRuO_3$, ITO, etc.), and/or a 2D material (e.g., graphene). The upper layer 50 may also include metal nitride or metal oxynitride. As another example, the upper layer 50 may include a layer including a material included in the first conductive layer 20. For example, the upper layer 50 may include an NbN layer. Here, the type of material forming the upper layer 50 may vary depending on the electronic device to which the thin film structure 10 according to an embodiment is applied.

Figure 4F:
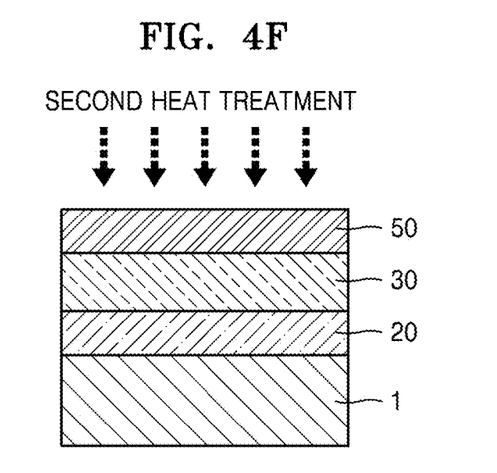
Figure 4G:
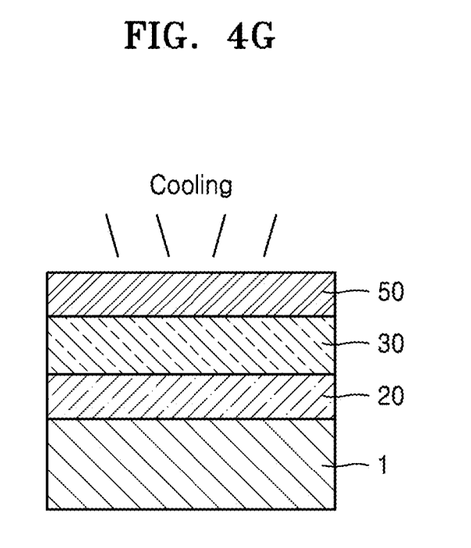

Next, as shown in FIGS. 4F and 4G, a phase of the dielectric material layer 30 may be changed by performing a second heat treatment on the thin film structure 10 in a state that the upper layer 50 is formed on the dielectric material layer 30.

Referring to FIG. 4F, during heating the thin film structure 10 in the second heat treatment process, the dielectric material layer 30 may be crystallized into a first crystal phase, for example, a tetragonal crystal phase. The crystalline phase of the dielectric material layer 30 may be metastable, and may, for example, transition to a different crystalline phase at different temperatures.

Afterwards, as shown in FIG. 4G, during cooling down, the phase may be changed into a second crystalline phase, such as an orthorhombic crystalline phase.

In this case, a heat treatment temperature in the second heat treatment process may be a temperature range applicable to processing a semiconductor device, for example, 400° C. to 600° C.

In this way, the dielectric material layer 30 may be made to exhibit a ferroelectric property by changing the phase of the dielectric material layer 30 through the second heat treatment process of the thin film structure 10 after forming the upper layer 50.

As described above, crystal nuclei are formed in the dielectric material layer 30 in the first heat treatment process performed after the dielectric material layer 30 is formed on the first conductive layer 20, and thus, may be crystallized into a first crystal phase, for example, a tetragonal crystalline phase. In the second heat treatment process performed after the upper layer 50 is formed on the dielectric material layer 30, the crystallization of the first crystal phase, for example, a tetragonal crystal phase, with respect to the dielectric material layer 30 increases and may, for example, crystallize on the whole dielectric material layer 30 into the first crystalline phase, and then change to a second crystalline phase, for example, an orthorhombic crystalline phase, while cooling.

According to the thin film structure 10 manufactured as described above, the thin film structure 10 may have a ferroelectric property while having a small thickness of 5 nm or less.

Figure 5:
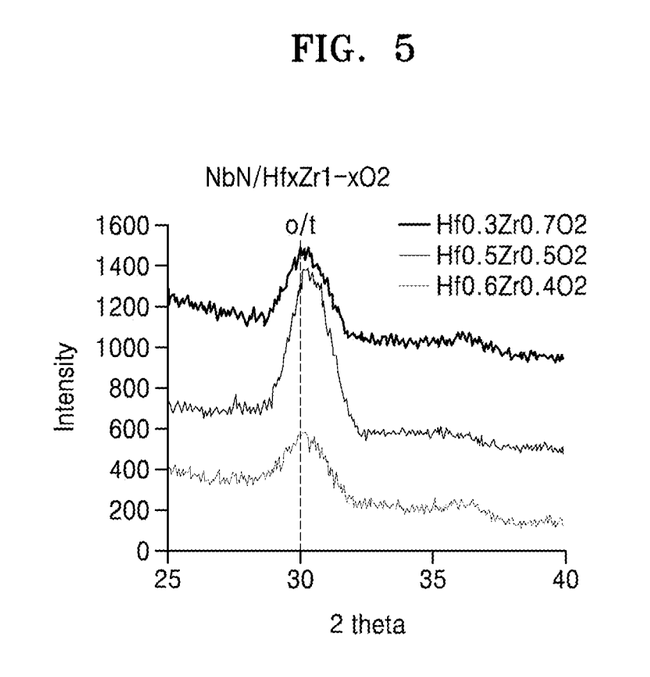
FIG. 5 is a graph schematically showing an XRD orthorhombic o/t crystallinity analysis with respect to stacked structure samples of first conductive layer/dielectric material layer (NbN/$Hf_xZr_{1-x}O_2$), in which the dielectric material layer has a thickness of about 4 nm.
Figure 6:
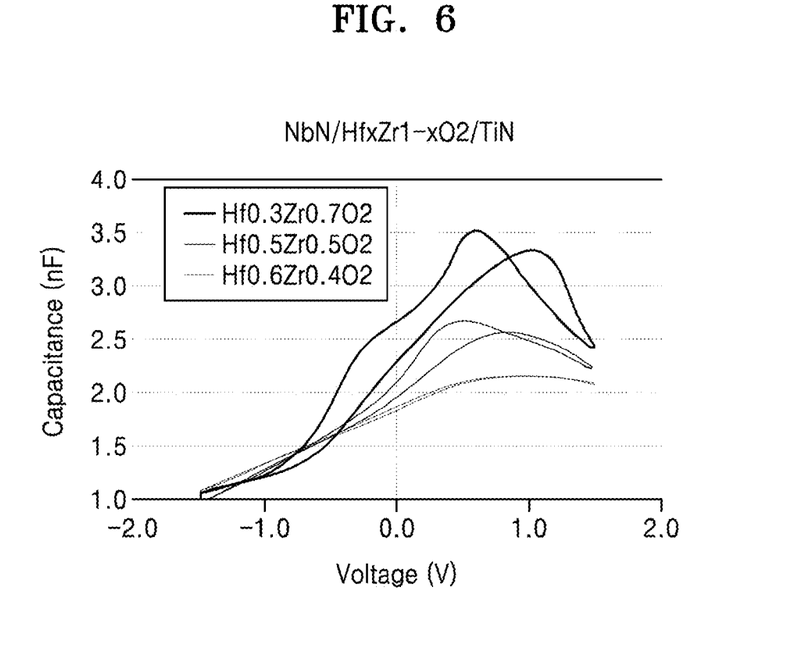
FIG. 6 a graph schematically showing an electrical characteristic of stacked structure samples of first conductive layer/dielectric material layer/second conductive layer (NbN/$Hf_xZr_{1-x}O_2$/TiN), in which the dielectric material layer has a thickness of about 4 nm.

FIG. 5 is a graph schematically showing an x-ray diffraction (XRD) orthorhombic o/t crystallinity analysis with respect to stacked structure samples of first conductive layer 20/dielectric material layer 30 (NbN/$Hf_xZr_{1-x}O_2$), in which the dielectric material layer 30 has a thickness of about 4 nm. FIG. 6 is a graph schematically showing an electrical characteristic of stacked structure samples of first conductive layer 20/dielectric material layer 30/second conductive layer (NbN/$Hf_xZr_{1-x}O_2$/TiN), in which the dielectric material layer 30 has a thickness of about 4 nm. FIGS. 5 and 6 show cases that the compositions x of Hf of the dielectric material layer 30 respectively are 0.3, 0.5, and 0.6.

Referring to FIG. 5, when x has a composition of 0.3 and 0.5, it may be seen that the graph shows a large peak and shows clear orthorhombic crystallinity, whereas, when x has a composition of 0.6 as the Hf content is increased, it may be seen that the graph shows a small peak and shows little crystallinity.

Referring to FIG. 6, even in a voltage-capacitance curve (CV curve), when x has a composition of 0.3 and 0.5, a butterfly-shaped hysteresis, which is a ferroelectric property, is clearly seen, whereas, in the case a sample in which x has a composition of 0.6 as the Hf content is increased, it may be seen that the ferroelectric property is not shown.

Figure 7:
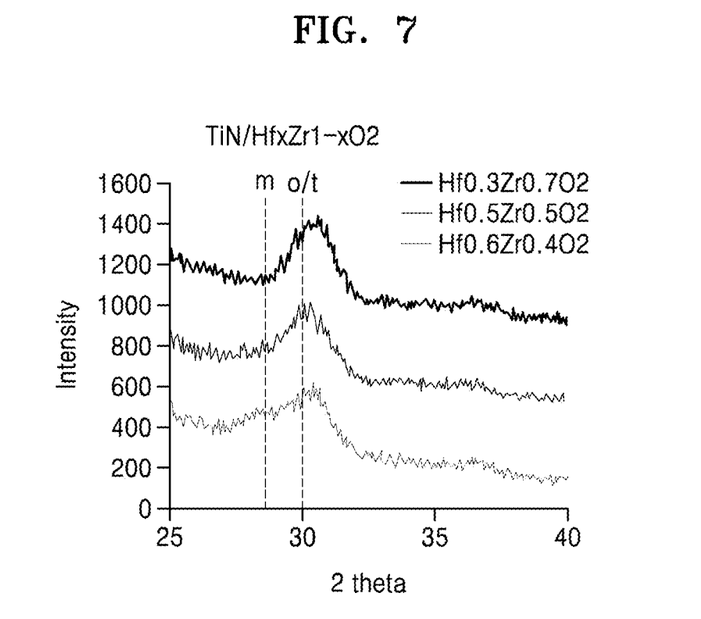
FIG. 7 is a graph schematically showing an XRD orthorhombic o/t crystallinity with respect to comparison samples of TiN/$Hf_xZr_{1-x}O_2$, in which the first conductive layer includes TiN and the dielectric material layer has a thickness of about 4 nm.
Figure 8:
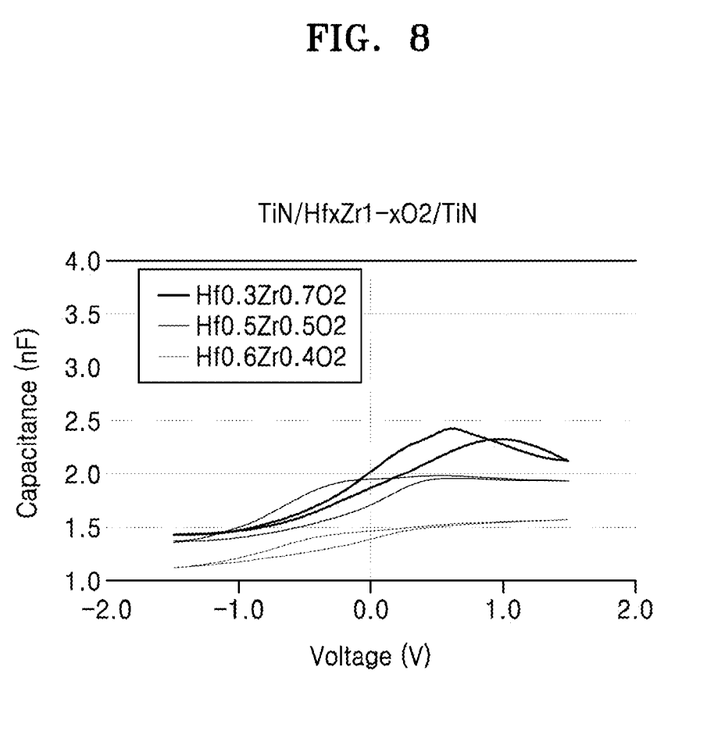
FIG. 8 is a graph schematically showing an electrical characteristic with respect to comparison samples of TiN/Hf$_x$Zr$_{1-x}$O$_2$/TiN in which the first conductive layer and the second conductive layer (upper layer) include TiN and the dielectric material layer has a thickness of about 4 nm.

As a comparative example, FIG. 7 is a graph schematically showing an XRD orthorhombic o/t crystallinity with respect to comparison samples of TiN/Hf$_x$Zr$_{1-x}$O$_2$, in which the first conductive layer includes TiN and the dielectric material layer has a thickness of about 4 nm; and FIG. 8 is a graph schematically showing an electrical characteristic with respect to comparison samples of TiN/Hf$_x$Zr$_{1-x}$O$_2$/TiN, in which the first conductive layer and the second conductive layer (upper layer) include TiN and the dielectric material layer has a thickness of about 4 nm.

FIGS. 7 and 8 show cases in which the compositions x of Hf of the dielectric material layer respectively are 0.3, 0.5, and 0.6.

Referring to FIG. 7, in the case of the comparative samples in which x has compositions of 0.3, 0.5, and 0.6, the graph shows that the peaks of crystallinity analysis are, on the whole, small, and thus, the orthorhombic crystallinity is almost not seen.

Referring to FIG. 8, even in the voltage-capacitance curve (CV curve), when the comparative sample in which x has a composition of 0.3, it may be seen that the butterfly-shaped hysteresis, which is a ferroelectric property, is weak and does not show a distinct ferroelectric property, and in the case when the comparative samples in which x has a composition of 0.5 and 0.6, it may be seen that no ferroelectric property is shown.

As may be seen from the XRD orthorhombic o/t crystallinity analysis graph and the electrical property graph of the example samples of FIGS. 5 and 6 and the comparative samples of FIGS. 7 and 8, as in the thin film structure 10 according to an embodiment, when the first conductive layer 20 includes NbN, the dielectric material layer 30 includes Hf$_x$Zr$_{1-x}$O$_2$ with a thickness of about 5 nm or less, and x has a composition of about 0.3 to 0.5, it may be seen that even when the thin film structure 10 having a small thickness of 5 nm or less is formed, the thin film structure 10 has a ferroelectric property.

In the case of the HfO$_2$ layer having a thickness of 5 nm or less, it is difficult to crystallize on the whole at a heat treatment temperature range, for example, 400° C. to 600° C. This is because the crystallization temperature of HfO$_2$ and the transition temperature of HfO$_2$ from a monoclinic phase to a tetragonal phase are higher than the crystallization and transition temperatures of ZrO$_2$. Accordingly, the crystallization temperature of the thin film structure 10 according to an embodiment may be reduced since the composition ratio x of HfO$_2$ in Hf$_x$A$_{1-x}$O$_2$, for example, Hf$_x$Zr$_{1-x}$O$_2$ for forming the dielectric material layer 30 is 0.3 to 0.5. In this way, a tetragonal phase may be formed at a normal heat treatment temperature for a semiconductor device by reducing the crystallization temperature. Also, after depositing the dielectric material layer 30 on the first conductive layer 20, crystal nuclei are formed in the first heat treatment process Next, in the second heat treatment process after forming the upper layer 50 on the dielectric material layer 30, the first crystal phase is fully-crystallized into a tetragonal phase, and afterwards, it may be changed into an orthorhombic phase while cooling.

Accordingly, according to the thin film structure 10 according to an embodiment, a ferroelectric property may be implemented while the thickness of the dielectric material layer 30 is 5 nm or less.

An electronic device to which the thin film structure 10 according to an embodiment is applied may be implemented as a capacitor, a transistor, ferroelectric memory, etc. For example, when the electronic device according to an embodiment is a capacitor, the electronic device includes the thin film structure 10 having a stacked structure of the first conductive layer 20, the dielectric material layer 30, and the upper layer 50 on the base layer 1, and the upper layer 50 includes a second conductive layer.

An electronic device having the thin film structure 10 may form an integrated device. The integrated device may form a part of an integrated circuit formed on a silicon base, and the integrated circuit may include a plurality of capacitors, transistors, memory devices, etc. Since the dielectric material layer 30 having a ferroelectric property is provided in the devices, a desired high performance and miniaturization may be realized.

While the thin film structure 10, a method of manufacturing the same, and an electronic device have been described with reference to accompanying drawings, these are merely exemplary and it should be understood that various changes in form and details may be made by those of ordinary skill in the art. Although practical details are described in the above description, it will be understood that they do not limit the technical scope of the present inventive concepts, but should be interpreted by the specific embodiments. The scope of the inventive concepts are defined not by the detailed description of the inventive concepts but by the appended claims, According to an embodiment, a thin film structure in which a dielectric material layer having a thickness of 5 nm or less and having a ferroelectric property and an electronic device to which the thin film structure is applied may be implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A thin film structure comprising:
   a first conductive layer;
   a dielectric material layer including Hf$_x$A$_{1-x}$O$_2$, the dielectric material layer satisfying at least one of a first condition and a second condition; and
   an upper layer on the dielectric material layer,
   wherein the first condition is the dielectric material layer having a thickness of about 5 nm or less, and the second condition is x in the Hf$_x$A$_{1-x}$O$_2$ is in a range of 0.3 to 0.5,
   wherein the dielectric material layer has ferroelectric property, and
   wherein the first conductive layer comprises NbN.

2. The thin film structure of claim 1, wherein the upper layer comprises a second conductive layer comprising at least one component different from components included in the first conductive layer.

3. The thin film structure of claim 1, wherein the dielectric material layer has an orthorhombic crystal phase.

4. The thin film structure of claim 1, wherein the upper layer comprises a second conductive layer including at least one component different from components included in the first conductive layer.

5. The thin film structure of claim 1, wherein the dielectric material layer has an orthorhombic crystal phase.

6. The thin film structure of claim 1, wherein A in $Hf_xA_{1-x}O_2$ comprises Zr.

7. An electronic device comprising:
a base layer; and
the thin film structure of claim 1 on the base layer.

8. The electronic device of claim 7, wherein A in $Hf_xA_{1-x}O_2$ comprises Zr.

9. The electronic device of claim 7, further comprising an insulating layer between the base layer and the thin film structure.

10. A method of manufacturing a thin film structure, the method comprising:
preparing a base layer;
forming a first conductive layer on the base layer;
forming a dielectric material layer on the first conductive layer to satisfy at least one of a first condition and a second condition, the first condition in which the dielectric material layer is formed to include $Hf_xA_{1-x}O_2$ to a thickness of 5 nm or less, and the second condition in which a composition of x in $Hf_xA_{1-x}O_2$ is in a range of 0.3 to 0.5;
performing a first heat treatment process on the dielectric material layer;
forming an upper layer on the dielectric material layer; and
performing a second heat treatment process so that the dielectric material layer has a ferroelectric property by changing a crystal phase of the dielectric material layer after forming the upper layer,
wherein the first conductive layer comprises NbN.

11. The method of claim 10, wherein the dielectric material layer crystallizes into a first crystalline phase in the first heat treatment process, and the first crystalline phase is changed into a second crystalline phase in the second heat treatment process.

12. The method of claim 11, wherein the second crystalline phase is an orthorhombic crystal phase.

13. The method of claim 12, wherein
the second heat treatment process comprises cooling the dielectric material layer after an application of heat, and
wherein crystal nuclei are formed in the dielectric material layer in the first heat treatment process, and
the dielectric material layer is crystallized into the first crystalline phase in the second heat treatment process, during the application of heat, and then, the first crystalline phase is changed into an orthorhombic crystalline phase during the cooling.

14. The method of claim 10,
the second heat treatment process comprises cooling the dielectric material layer after an application of heat, and
wherein crystal nuclei are formed in the dielectric material layer in the first heat treatment process, and
the dielectric material layer is crystallized into a first crystalline phase in the second heat treatment process, during the application of heat and then the first crystalline phase is changed into an orthorhombic crystalline phase during the cooling.

15. The method of claim 10, wherein, at least one of the first and second heat treatment processes is in a temperature range applicable to a semiconductor device.

16. The method of claim 10, wherein the upper layer comprises a second conductive layer including at least one component different from components included in the first conductive layer.

17. The method of claim 10, wherein A in $Hf_xA_{1-x}O_2$ comprises Zr.

18. The method of claim 10, wherein A in $Hf_xA_{1-x}O_2$ comprises Zr.

* * * * *